United States Patent [19]

Suzuki

[11] Patent Number: 5,477,501
[45] Date of Patent: Dec. 19, 1995

[54] SEMICONDUCTOR RANDOM ACCESS MEMORY DEVICE HAVING DIGIT LINES SELECTIVELY EXTENDING ON INTER-LEVEL INSULATING LAYERS

[75] Inventor: Hisamitsu Suzuki, Tokyo, Japan

[73] Assignee: NEC Corporation, Tokyo, Japan

[21] Appl. No.: 360,618

[22] Filed: Dec. 21, 1994

[30] Foreign Application Priority Data

Dec. 28, 1993 [JP] Japan ................................ 5-336647

[51] Int. Cl.6 ............................................... G11C 11/40
[52] U.S. Cl. .................. 365/230.01; 365/51; 365/189.01
[58] Field of Search .................................. 365/51, 189.01, 365/230.01, 189.05, 230.03

[56] References Cited

U.S. PATENT DOCUMENTS 5,430,672   7/1995   Kywabara et al. ................. 365/230.03

OTHER PUBLICATIONS

"16Mbit SRAM Cell Technologies for 2.0 V Operation", Ohkubo et al., IEDM 91, pp. 481–484.

"A High–Performance Quadruple Well, Quadruply Poly BiCMOS Process For Fast 16Mb SRAMs", Hayden et al., IEDM 92, 819–822.

Primary Examiner—Terrell W. Fears
Attorney, Agent, or Firm—Sughrue, Mion, Zinn, Macpeak & Seas

[57] ABSTRACT

A semiconductor static random access memory device has a plurality of memory cells selectively connected to digit lines, and the digit lines are formed on different inter-level insulating layers in a partially overlapped manner so as to scale down the memory cells only.

9 Claims, 12 Drawing Sheets

SEMICONDUCTOR RANDOM ACCESS MEMORY DEVICE HAVING DIGIT LINES SELECTIVELY EXTENDING ON INTER-LEVEL INSULATING LAYERS

FIELD OF THE INVENTION

This invention relates to a semiconductor random access memory device and, more particularly, to a semiconductor memory device having digit lines selectively extending on inter-level insulating layers.

DESCRIPTION OF THE RELATED ART

Various semiconductor static random access memory device have been proposed. A static random access memory cell implemented by complementary field effect transistors is disclosed in "16 Mbit SRAM Cell Technologies for 2.0 V Operation", 1991 International Electron Devices Meeting Technical Digest, pages 481 to 484, and a static random access memory device implemented by a bi-CMOS circuit or a combination of bipolar transistors and complementary field effect transistors is disclosed in "A High-Performance Quadruple Well, Quadruple Poly BICMOS Process for Fast 16 Mb SRAMs", 1992 International Electron Devices Meeting Technical Digest, pages 819 to 822. The paper reporting the 16 Mbit SRAM cell is hereinbelow referred to as "first paper", and the paper reporting the bi-CMOS process is referred to as "second paper".

The circuit arrangement of the prior art static random access memory cells disclosed in both first and second papers is illustrated in FIG. 1, and the prior art static random access memory cell comprises a first complementary inverter INV1 or a series of p-channel enhancement type load transistor Qp1 and an n-channel enhancement type driving transistor Qd1 connected between a first power voltage line VCC and a second power voltage line VSS, a second complementary inverter INV2 or a series of a p-channel enhancement type load transistor Qp2 and an n-channel enhancement type driving transistor Qd2 also connected between the first power voltage line VCC and the second power voltage line VSS and two n-channel enhancement type access transistors Qt1 and Qt2. The n-channel enhancement type driving transistors Qd1 and Qd2 and the n-channel enhancement type access transistors Qt1 and Qt2 are bulk transistors, and have respective source/drain regions in a silicon substrate. On the other hand, the p-channel enhancement type load transistors Qp1 and Qp2 are thin film transistors, and have respective source/drain regions in polysilicon films over the silicon substrate.

The n-channel enhancement type access transistors Qt1 and Qt2 are gated by word lines WL1 and WL2, and provide source-drain current paths between digit lines DL1/DL2 and common drain nodes N1/N2. The common drain node N1 is connected to the gate electrode of the p-channel enhancement type load transistor Qp2 and the gate electrode of the n-channel enhancement type driving transistor Qd2, and the gate electrodes of the other load/driving transistors Qp1/Qd1 are connected to the other common drain node N2.

While the word lines WL1 and WL2 are staying in inactive low level, the n-channel enhancement type access transistors Qt1 and Qt2 are turned off, and a data bit is stored in the form of potential difference between the common drain nodes N1 and N2.

If the word lines WL1 and WL2 are changed to active high level, the n-channel enhancement type access transistors Qt1 and Qt2 turn on, and the common drain nodes N1 and N2 are electrically connected to the digit lines DL1 and DL2 for a read-out or a write-in of the data bit.

The layout of the bulk transistors Qd1/Qd2 and Qt1/Qt2 and the layout of the thin film transistors Qp1/Qp2 are respectively illustrated in FIGS. 2A and 2B, and FIG. 3 illustrates a layout of a part of a static random access memory cell array including the static random access memory cell shown in FIGS. 1, 2A and 2B. FIG. 4 shows a cross section taken along line A—A of FIG. 3.

Referring first to FIG. 2A, two active areas A1 and A2 are defined in the silicon substrate. The active area A1 provides the source/drain regions for the n-channel enhancement type access transistor Qt1 and the source/drain regions for the n-channel enhancement type driving transistor Qd1. The common drain region N1 is provided in the active area A1 between the n-channel enhancement type access transistor Qt1 and the n-channel enhancement type driving transistor Qd1. The active area A1 is connected through a digit line contact Cd1 to the digit line DL1 (not shown in FIG. 2A), and is further connected through a ground contact Cg1 to the second power supply line VSS.

Similarly, the active area A2 provides the source/drain regions for the n-channel enhancement type access transistor Qt2 and the source/drain regions for the n-channel enhancement type driving transistor Qd2. The common drain region N2 is provided in the active area A2 between the n-channel enhancement type access transistor Qt2 and the n-channel enhancement type driving transistor Qd2. The active area A2 is connected through a digit line contact Cd2 to the digit line DL2 (not shown in FIG. 2A), and is further connected through a ground contact Cg2 to the second power supply line VSS. The source/drain regions of the n-channel enhancement type access/driving transistors Qt1/Qd1 and Qt2/Qd2 are hatched for easy discrimination.

The word line WL1 passes over a channel region of the n-channel enhancement type access transistor Qt1, and the common drain node N1 is connected through a common contact hole Cdp1 to a gate electrode GE1 of the n-channel enhancement type driving transistor Qd2 and a gate electrode GE3 of the p-channel enhancement type load transistor Qp2 (see FIG. 2B). The gate electrode GE3 is connected through a contact hole Cpg2 to a polysilicon film PL1 for the p-channel enhancement type load transistor Qp1.

Similarly, the word line WL2 passes over a channel region of the n-channel enhancement type access transistor Qt2, and the common drain node N2 is connected through a common contact hole Cdp2 to a gate electrode GE2 of the n-channel enhancement type driving transistor Qd1 and a gate electrode GE4 of the p-channel enhancement type load transistor Qp1 (see FIG. 2B). The gate electrode GE4 is connected through a contact hole Cpg2 to a polysilicon film PL2 for the p-channel enhancement type load transistor Qp2.

The polysilicon strips PL1 and PL2 provide source/drain regions for the p-channel enhancement type load transistors Qp1/Qp2, and the source/drain regions are partially hatched in FIG. 2B for easy discrimination. The polysilicon strips PL1 and PL2 are merged into the first power supply line VCC.

The pair of digit lines DL1/DL2 extends in parallel to other digit line pairs DL1/DL2 as shown in FIG. 3, and the structure around the digit line contact Cd2 is illustrated in FIG. 4. The first paper teaches the pitch (S+L) of the digit lines DL1/L2 at 0.9 micron, and the pitch (S+L) in the second paper is 0.95 micron and 1.05 microns. The adjacent two digit line pairs DL1/DL2 and the adjacent two static random access memory cells are arranged in such a manner as to be reflected on a mirror.

The active area A1 and, accordingly the layout of the n-channel enhancement type access/driving transistors Qt1/Qd1 are symmetrical with the active area A1 and accordingly, the n-channel enhancement type access/driving transistors Qt2/Qd2, and the polysilicon strip PL1 and the p-channel enhancement type load transistor Qp1 are also symmetrical with the polysilicon strip PL2 and the p-channel enhancement type load transistor Qp2.

The prior art static random access memory cell is fabricated through the following process. The n-type silicon substrate 10 is firstly prepared, and a p-type well 11 is formed in a surface portion of the n-type silicon substrate 10 (see FIG. 4). A thick field oxide layer 12 is selectively grown in the surface of the n-type silicon substrate 10 and the p-type well 11 to thickness of 250 to 600 nanometers, and the thick field oxide layer 12 defines the active areas A1 and A2. Thin gate oxide films are grown on the active areas A1 and A2, and the common contact holes Cdp1 and Cdp2 are formed in the thin gate oxide films for exposing areas assigned to the common drain regions N1 and N2.

Polysilicon is deposited over the entire surface, and the polysilicon layer is patterned through a lithographic process for providing the word lines WL1/WL2 and the gate electrodes GE1/GE2. N-type dopant impurity is ion implanted into the active areas A1 and A2, the word lines WL1/WL2 and the gate electrodes GE1/GE2, and the source and drain regions are formed in a self-aligned manner with the word lines WL1/WL2 and the gate electrodes GE1/GE2.

An inter-level insulating layer 13 is deposited over the entire surface of the structure, and the word lines WL1/WL2 and the gate electrodes GE1/GE2 are covered with the inter-level insulating layer 13. The ground contact holes Cg1 and Cg2 are formed through the inter-level insulating layer 13 and the gate oxide films, and the source regions of the n-channel enhancement type driving transistors Qd1/Qd2 are exposed. A conductive substance is deposited over the entire surface of the structure, and the conductive layer is patterned into the second power voltage line VSS. The second power voltage line VSS is held in contact through the ground contact holes Cg1/Cg2 with the source regions of the n-channel enhancement type driving transistors Qd1/Qd2.

An inter-level insulating layer 14 is deposited over the entire surface of the structure, and the second power voltage line VSS is covered with the inter-level insulating layer 14. The contact holes Cdp1/Cdp2 are formed in the inter-level insulating layer 14, and the gate electrodes GE1/GE2 are exposed to the contact holes Cdp1/Cdp2. A conductive substance is deposited over the entire surface of the structure and the conductive layer is patterned into the gate electrodes GE3/GE4. The gate electrodes GE3/GE4 are held in contact through the contact holes Cdp1/Cdp2 with the gate electrodes GE1/GE2.

A thin insulating film 15 is deposited, and serves as gate oxide films of the p-channel enhancement type load transistors Qp1/Qp2. The contact holes Cpg1/Cpg2 are formed in the thin insulating film 15, and polysilicon is deposited over the entire surface. The polysilicon is patterned into the polysilicon strips PL1/PL2, and the source and drain regions are formed in the polysilicon strips PL1/PL2 as indicated by the hatching lines.

An inter-level insulating layer 16 is deposited over the entire surface of the structure to thickness of 200 to 1000 nanometers by using the chemical vapor deposition, and digit line contact holes Cd1/Cd2 are formed through the inter-level insulating layers 13 to 16 through anisotropic etching. The contact holes Cd1/Cd2 are plugged by using aluminum or tungsten pieces 17.

Aluminum or copper is deposited over the entire surface to thickness of 300 to 1000 nanometers, and the digit lines DL1/DL2 are patterned from the aluminum/copper layer.

The prior art 16 mega-bit static random access memory devices the digit lines DL1/DL2 arranged at the pitches of 1 micron or the less. However, the digit lines DL1/DL2 are thick enough to propagate the potential differences indicative of the data bits at high speed.

If the prior art static random access memory cells are scaled down for integrating 64 mega-bits on the same semiconductor chip as the 16 mega-bit static random access memory device, the real estate assigned to each memory cell is a quarter of the real estate for each of the 16 mega-bit static random access memory cells, and the length and the width are decreased to a half. The digit lines are arranged at pitches of about 0.5 micron. However, the thickness of the digit lines are not increased, because the projection aligner can not exactly transfer the miniature digit line patter to a thicker photo-resist layer required by a thicker digit lines. Therefore, the thickness of the digit lines for the 64 mega-bit static random access memory device are decreased at 20 to 40 percent.

As a result, the resistance of each digit line becomes larger than that of the 16 mega-bit static random access memory device, and the signal delay is never ignoreable.

SUMMARY OF THE INVENTION

It is therefore an important object of the present invention to provide a semiconductor static random access memory device which is increased in integration density without serious signal delay.

To accomplish the object, the present invention proposes to selectively provide digit lines on different inter-level insulating layers.

In accordance with the present invention, there is provided a semiconductor memory device fabricated on a semiconductor substrate, comprising: a memory cell array having a plurality of memory cells formed on a surface of the semiconductor substrate for storing data information; a plurality of word lines selectively connected to the plurality of memory cells so as to allow an external device to selectively access the plurality of memory cells; a plurality of data propagation paths selectively connected to the plurality of memory cells for transferring the data information from the memory cell array; an interface means for communicating the external device; an addressing system selectively energizing the plurality of word lines for transferring the data information through the plurality of data propagation paths between the memory cell array and the interface means; and an inter-level insulating film structure covering the memory cell array and the plurality of word lines, and having a plurality of inter-level insulating layers, the plurality of data propagation paths being selectively formed on the plurality of inter-level insulating layers.

The data propagation paths on the different inter-level insulating layers may be partially overlapped with one another. Moreover, the semiconductor memory device may be a static random access memory device.

BRIEF DESCRIPTION OF THE DRAWINGS

The features and advantages of the semiconductor static random access memory device according to the present invention will be more clearly understood from the following description taken in conjunction with the accompanying drawings in which.

DESCRIPTION OF THE PREFERRED EMBODIMENTS

First Embodiment

Figure 5:
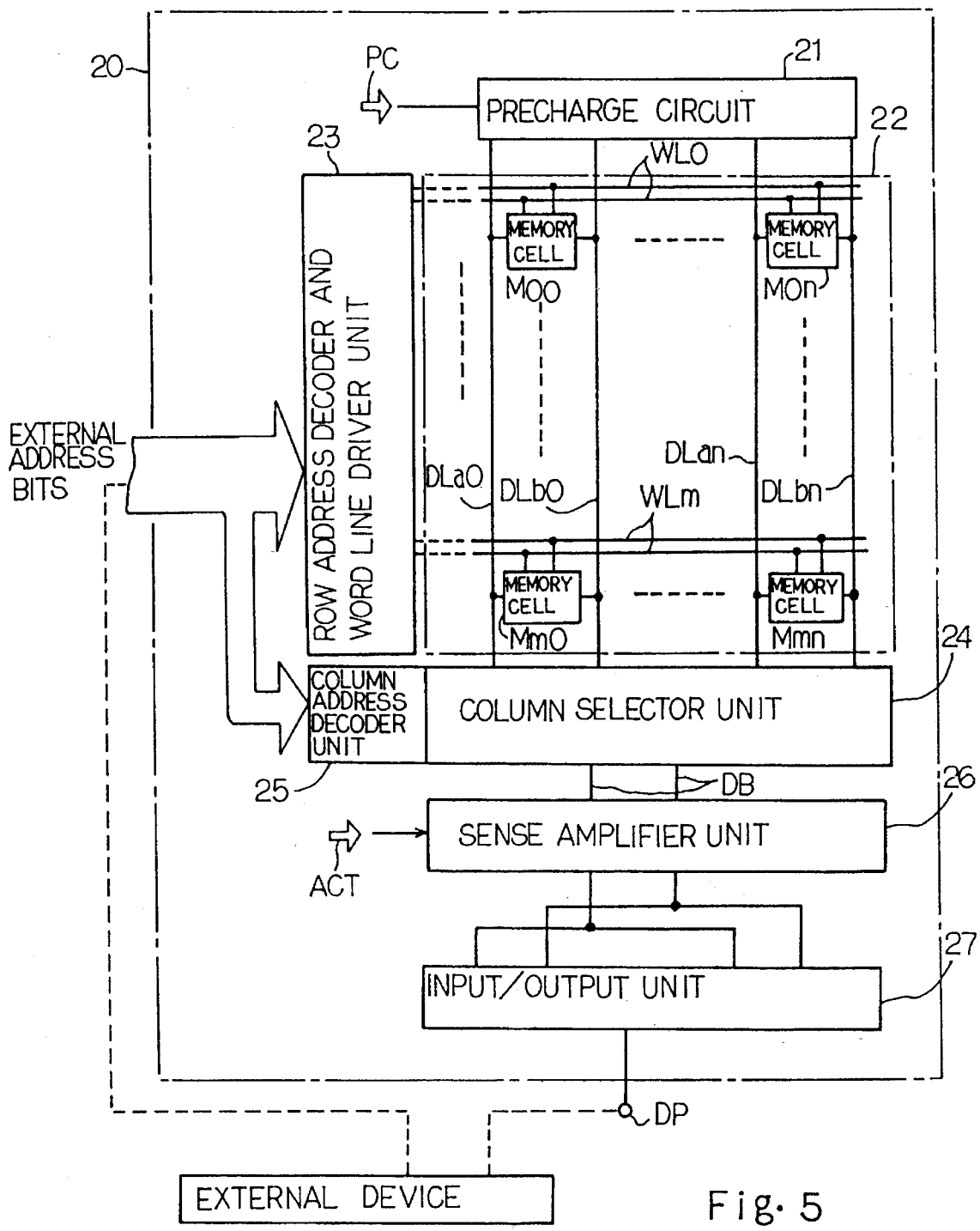
FIG. 5 is a block diagram showing the arrangement of a semiconductor static random access memory device according to the present invention.

Referring to FIG. 5 of the drawings, a semiconductor static random access memory device is fabricated on a single semiconductor chip 20, and comprises a precharge circuit 21, a memory cell array 22 implemented by a plurality of memory cells M00, . . M0n, . . . , Mm0, . . . and Mmn arranged in rows and columns, word lines WL0, . . . and WLm, digit lines DLa0, DLb0, . . . . . , DLan and DLbn, a row address decoder/word line driver unit 23 for selectively energizing the word lines WL0 to WLm, a column selector unit 24 coupled between the digit lines DLa0/DLb0 to DLan/DLbn and a data bus DB, a column address decoder unit 25 for controlling the column selector unit 24, a sense amplifier unit 26 coupled to the data bus DB and an input/output unit 27 also connected to the data bus DB.

The word lines WL0 to WLm are respectively associated with the rows of memory cells M00 to Mmn. The digit lines DLa0 to DLan are respectively paired with the digit lines DLb0 to DLbn, and the digit line pairs DLa0/DLb0 to DLan/DLbn are respectively associated with the columns of memory cells M00 to Mmn. The precharge circuit 21 is connected to the digit line pairs DLa0/DLb0 to DLan/DLbn, and is responsive to a precharge control signal PC for balancing the digit lines DLa0 to DLan with the digit lines DLb0 to DLbn. In this instance, the digit lines DLa0/DLb0 to DLan/DLbn serve as a plurality of data propagation paths.

Figure 1:
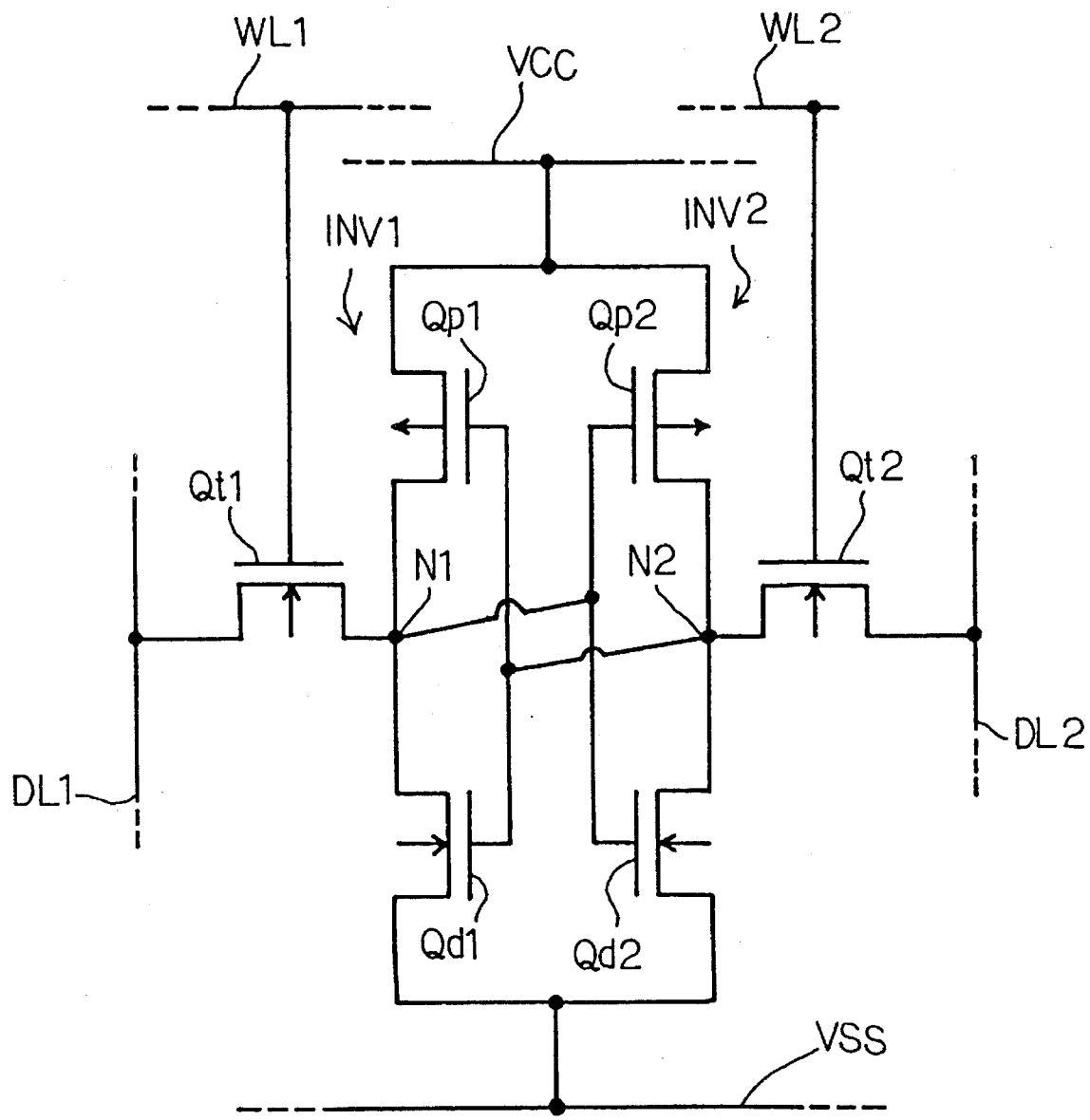
FIG. 1 is a circuit diagram showing the arrangement of the prior art static random access memory cell.
Figure 2A:
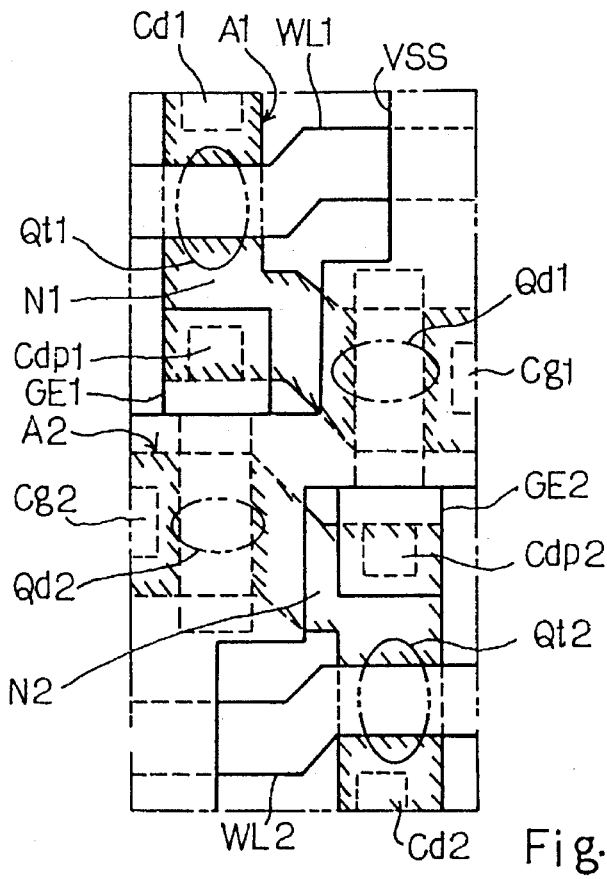
FIG. 2A is a plan view showing the layout of the bulk transistors forming parts of the prior art static random access memory cell.
Figure 2B:
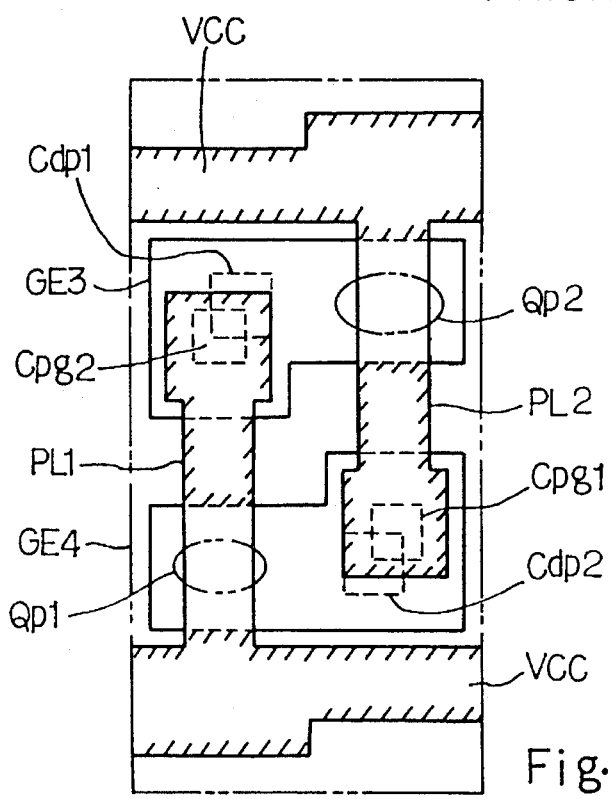
FIG. 2B is a plan view showing the layout of the thin film transistors forming parts of the prior art static random access memory cell.
Figure 3:
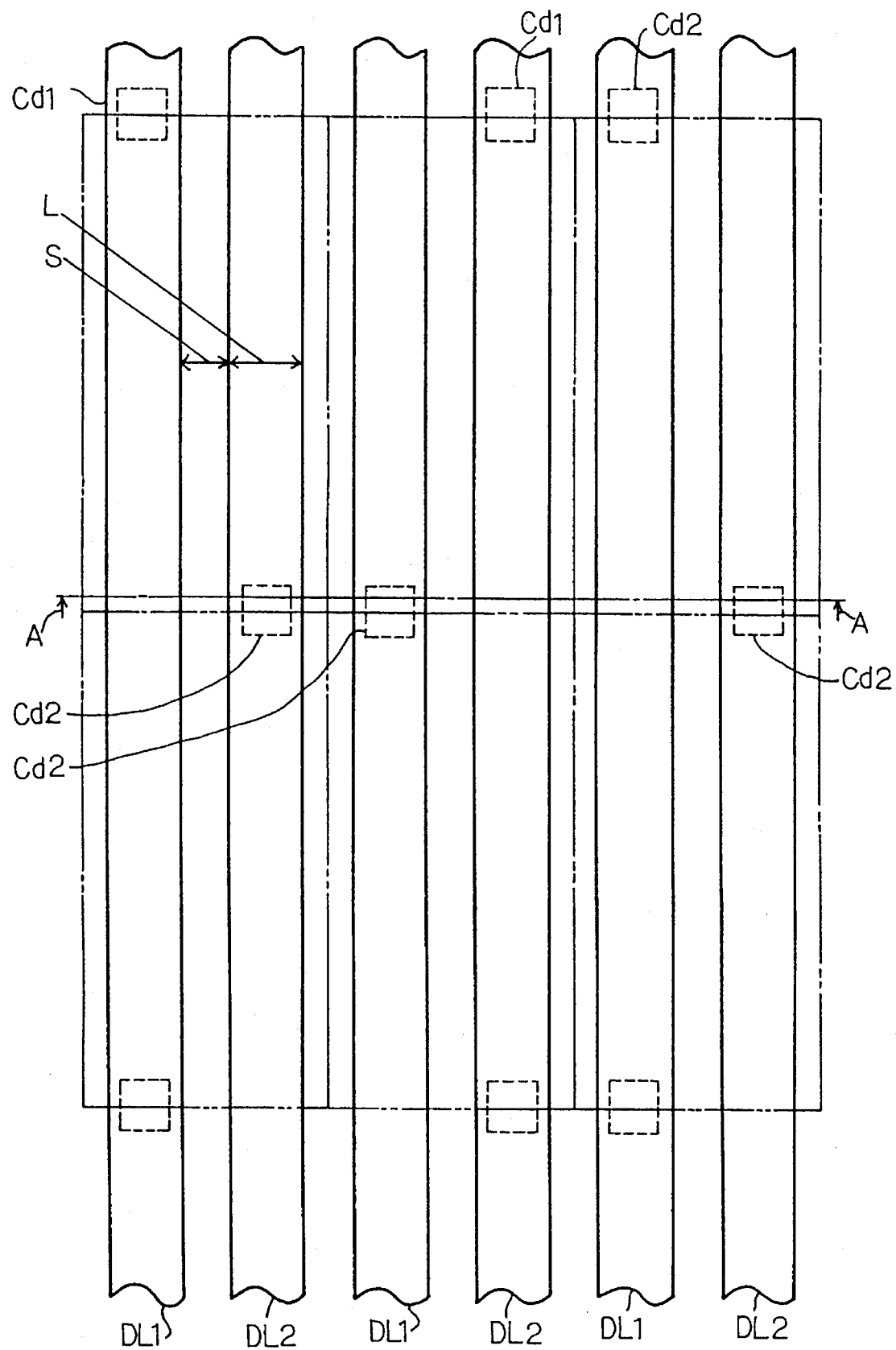
FIG. 3 is a plan view showing the layout of the digit lines incorporated in the prior art semiconductor static random access memory device.
Figure 4:
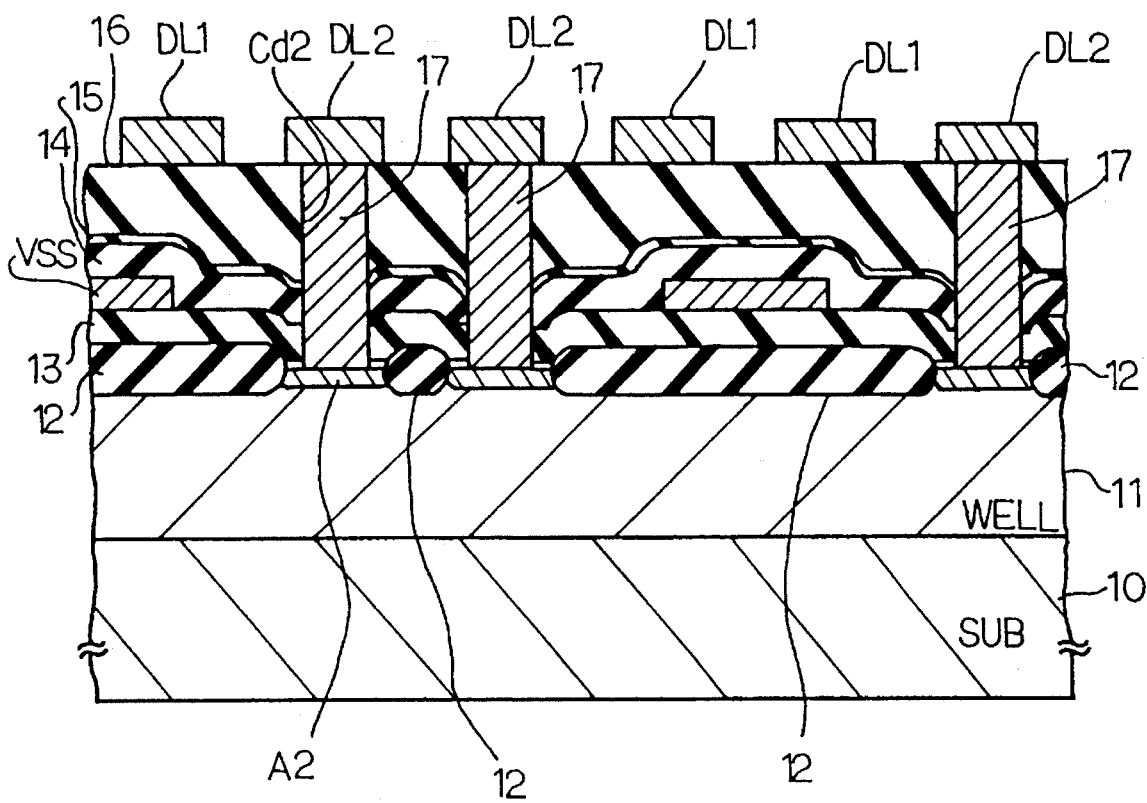
FIG. 4 is a cross sectional view taken along line A—A of FIG. 3 and showing the structure of the prior art semiconductor static random access memory device.

The memory cells M00 to Mmn are similar in circuit arrangement to the static random access memory cell shown in FIG. 1. Namely, each memory cells M00 to Mmn has a pair of p-channel enhancement type load transistors Qp1/Qp2, a pair of n-channel enhancement type driving transistors Qd1/Qd2 and a pair of n-channel enhancement type access transistors Qt1/Qt2, and memory nodes MN1 and MN2 are provided between the p-channel enhancement type load transistor Qp1 and the n-channel enhancement type driving transistors Qd1 and between the p-channel enhancement type load transistor Qp2 and the n-channel enhancement type driving transistor Qd2. The memory node MN1 is connected to the gate electrode of the p-channel enhancement type load transistor Qp2 and the n-channel enhancement type driving transistor Qd2, and the other memory node MN2 is connected to the gate electrode of the p-channel enhancement type load transistor Qp1 and the n-channel enhancement type driving transistor Qd1. The associated word lines WL0/WLm concurrently gate the n-channel enhancement type access transistors Qt1 and Qt2. The n-channel enhancement type driving transistors Qd1/Qd2 and the n-channel enhancement type access transistors Qt1/Qt2 are bulk transistors, and the p-channel enhancement type load transistors Qp1 and Qp2 are thin film transistors.

The p-channel enhancement type load transistors Qp1 and Qp2 and the n-channel enhancement type driving transistors Qd1 and Qd2 form a flip flop circuit.

The row address decoder and word line driver unit 23 is responsive to external row address bits for energizing one of the word lines WL0 to WLm, and the column address decoder unit 25 is responsive to external column address bits for selectively coupling the digit lines DLa0/DLb0 to DLan/DLbn to the data bus DB. The row address decoder and word line driver unit 23, the column selector unit 24 and the column address decoder unit 25 as a whole constituted an addressing system.

The sense amplifier unit 26 is responsive to an activation signal ACT for developing a potential difference indicative of a data bit. The input/output unit 27 generates an output data signal from the potential difference developed by the sense amplifier unit 26 in a read-out phase, and produces a potential difference from an input data signal supplied through a data pin DP in a write-in phase.

The semiconductor static random access memory device behaves as similar to the prior art semiconductor static random access memory device in the write-in phase and the read-out phase, and description on the write-in phase and the read-out phase is omitted for the sake of simplicity.

Figure 6:
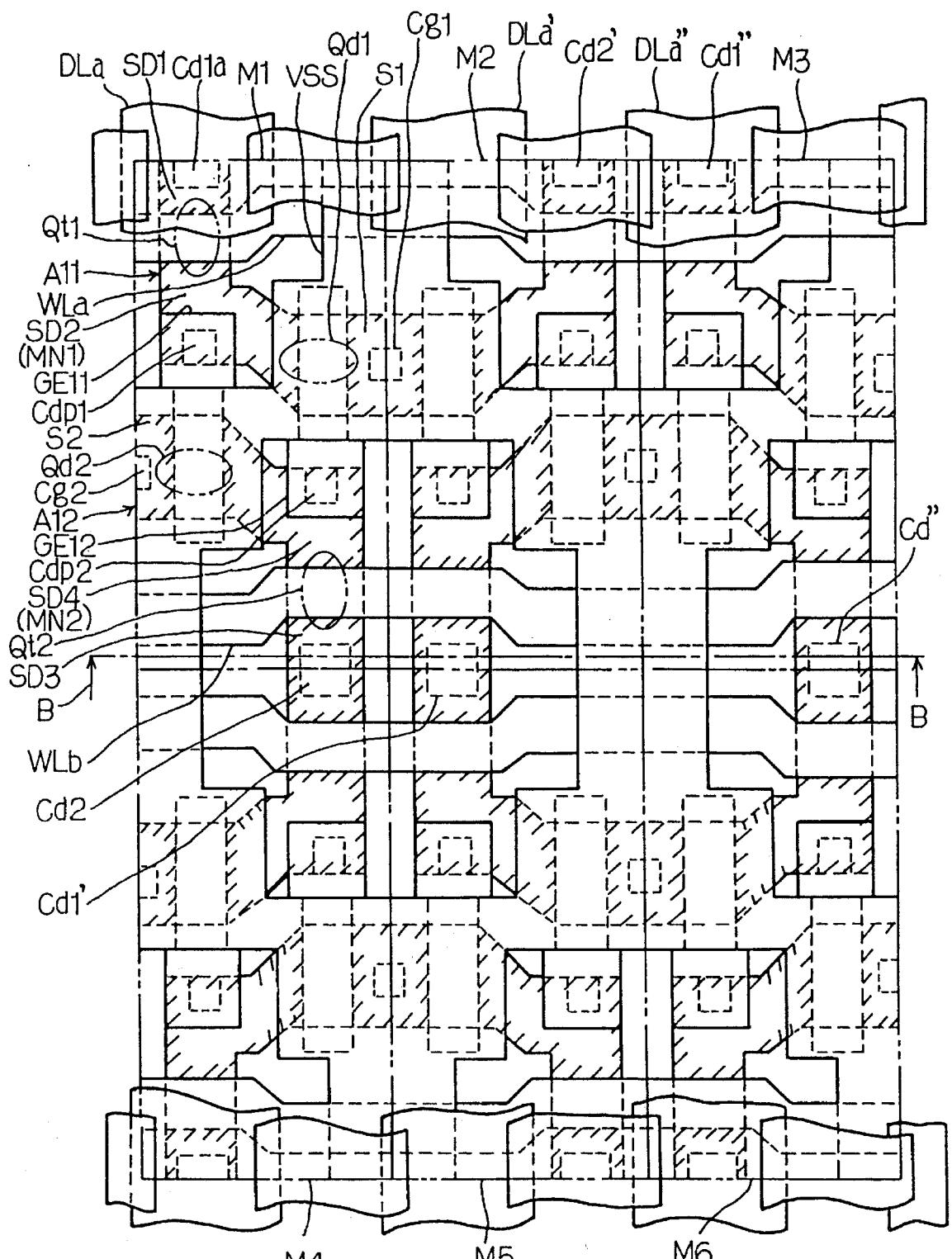
FIG. 6 is a plan view showing the layout of bulk transistors incorporated in the semiconductor static random access memory device.
Figure 7:
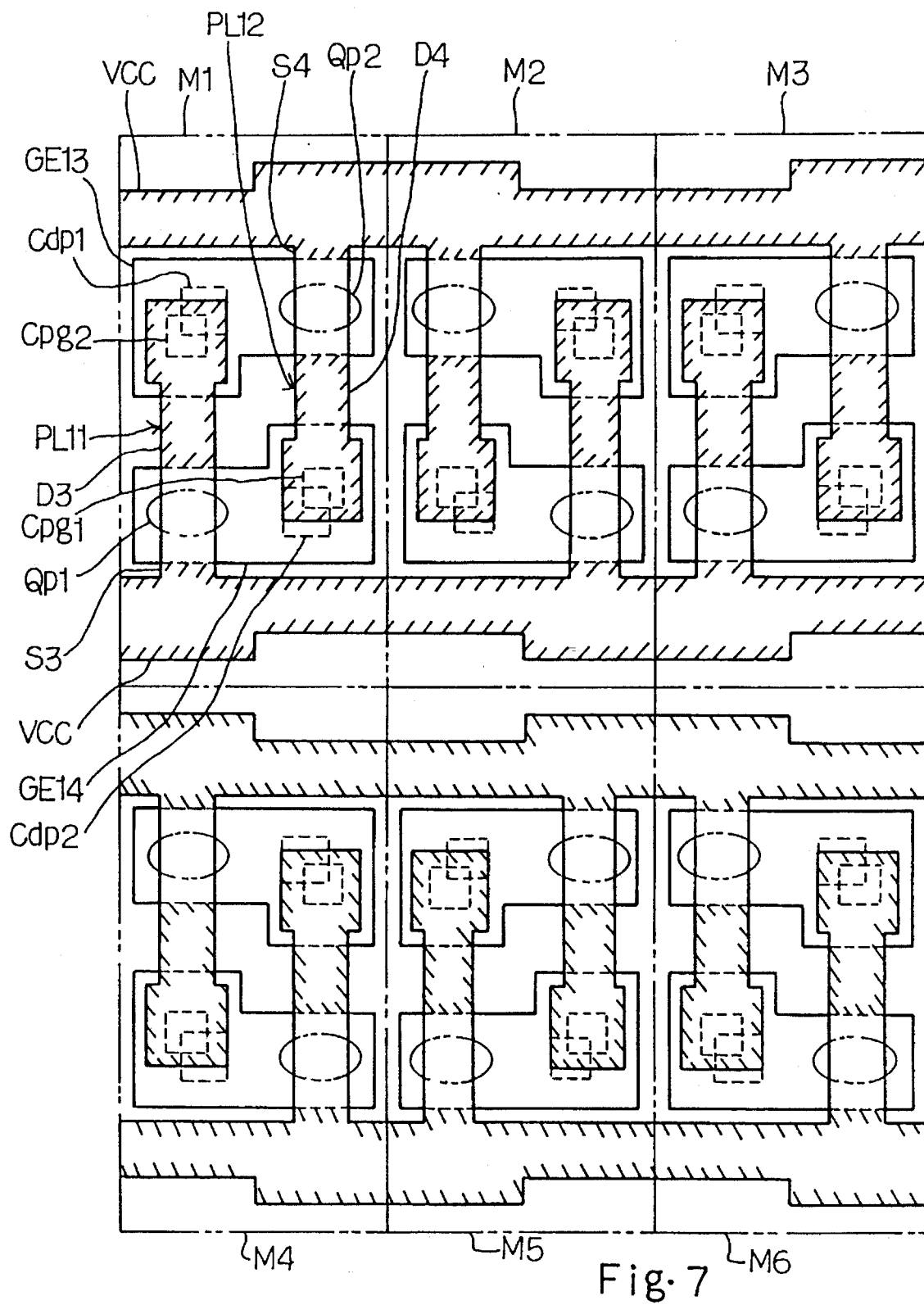
FIG. 7 is a plan view showing the layout of thin film transistors incorporated in the semiconductor static random access memory device.
Figure 8:
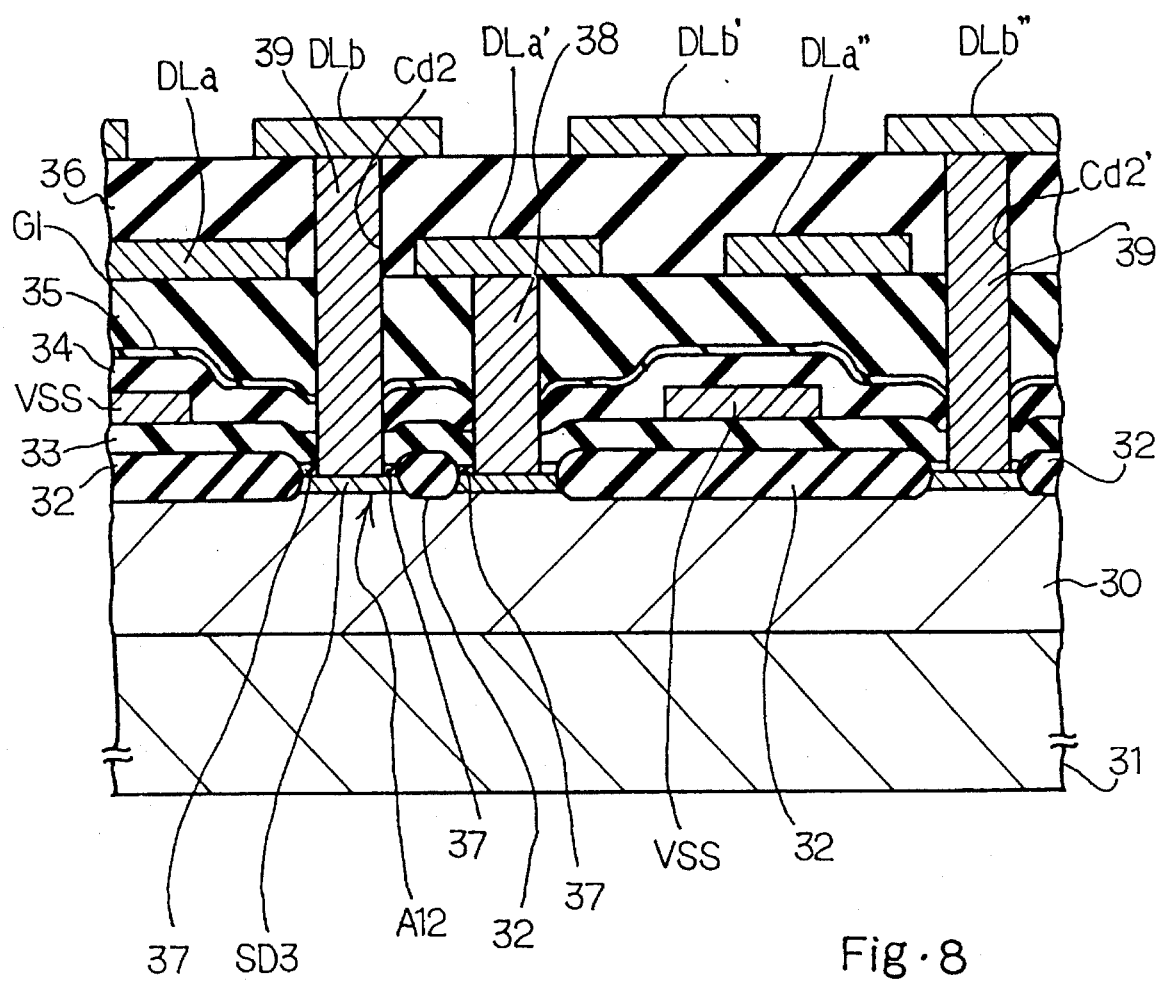
FIG. 8 is a cross sectional view taken along line B—B of FIG. 6 and showing the structure of the semiconductor static random access memory device.

Turning to FIGS. 6, 7 and 8 of the drawings, the bulk transistors Qd1/Qd2 and Qt1/Qt2 are fabricated on a p-type well 30 formed in an n-type silicon substrate 31, and the thin film transistors Qp1 and Qp2 are formed over the bulk transistors Qd1/Qd2 and Qt1/Qt2. The n-type silicon substrate 31 and the p-type well 30 provide a foundation of the semiconductor chip 20, and as a whole constitute a semiconductor substrate according to the present invention.

Although FIGS. 6 and 7 illustrate six memory cells M1, M2, M3, M4, M5 and M6 forming parts of the memory cell array 22, description is made on the memory cell M1 located at the left corner of the first row.

Referring to FIG. 6 of the drawings, two active areas A11 and A12 are defined in the p-type well 30, and the two active areas A11 and A12 are respectively assigned to the n-channel enhancement type access/driving transistors Qt1/Qd1 and the other n-channel enhancement type access/driving transistors Qt2/Qd2, respectively. The active area A11 provides the source/drain regions SD1/SD2 for the n-channel enhancement type access transistor Qt1 and the source/drain regions S1/SD2 for the n-channel enhancement type driving transistor Qd1. The drain node SD2 serves as the memory node MN1. The active area A11 is connected through a digit line contact Cd1a to one of the digit lines DLa0 to DLan, and the digit line is labeled with DLa in FIG. 6. The active area A11 is further connected at the source region S1 through a ground contact Cg1 to a ground voltage line VSS.

Similarly, the active area A12 provides the source/drain regions SD3/SD4 for the n-channel enhancement type access transistor Qt2 and the source/drain regions S2/SD4 for the n-channel enhancement type driving transistor Qd2. The drain node SD4 serves as the memory node MN2. The active area A12 is connected through a digit line contact Cd2 to the digit line DLb paired with the digit line DLa, and is further connected through a ground contact Cg2 to the ground voltage line VSS. The source/drain regions SD1/SD2, S1/SD2, SD3/SD4 and S2/SD4 of the n-channel enhancement type access/driving transistors Qt1/Qd1 and Qt2/Qd2 are hatched for easy discrimination.

One of the word lines WL0 to WLm passes over a channel region of the n-channel enhancement type access transistor Qt1, and is labeled with "WLa". The drain node SD2 is connected through a common contact hole Cdp1 to a gate electrode GE11 of the n-channel enhancement type driving transistor Qd2 and a gate electrode GE13 of the p-channel enhancement type load transistor Qp2. The gate electrode GE13 is covered with a gate insulating film GI (see FIG. 8), and is connected through a contact hole Cpg1 of the gate insulating film GI to a polysilicon film PL11 for the p-channel enhancement type load transistor Qp1 (see FIG. 7).

Similarly, another word line WLb paired with the word line WLa passes over a channel region of the n-channel enhancement type access transistor Qt2, and the drain node SD4 is connected through a common contact hole Cdp2 to a gate electrode GE12 of the n-channel enhancement type driving transistor Qd1 and a gate electrode GE14 of the p-channel enhancement type load transistor Qp1. The gate electrode is covered with a gate insulating film GI, and is connected through a contact hole Cpg2 of the gate insulating film GI to a polysilicon film PL12 for the p-channel enhancement type load transistor Qp2 (see also FIG. 7).

The polysilicon strips PL11 and PL12 provide source/drain regions S3/D3 and S4/D4 for the p-channel enhancement type load transistors Qp1 and Qp2, and the source/drain regions S3/D3 and S4/D4 are partially hatched in FIG. 7 for easy discrimination. The polysilicon strips PL11 and PL12 are merged into a positive power supply line VCC.

Turning to FIG. 8 of the drawings, the active areas A11 and A12 is defined by a thick field insulating layer 32, and the n-channel enhancement type access/driving transistors Qt1/Qt2/Qd1/Qd2 are covered with a first inter-level insulating layer 33. The ground voltage line VSS is covered with a second inter-level insulating layer 34, and the gate electrode GE13 and GE14, the gate insulating films GI and the polysilicon strips PL11 and PL12 extend on the second inter-level insulating layer 34. The polysilicon strips PL11 and PL12 are covered with a third inter-level insulating layer 35. The digit lines DLa and other digit lines DLa0 to DLan extend on the third inter-level insulating layer 35, and a fourth inter-level insulating layer 36 covers the digit lines DLa and DLa0 to DLan. The digit line DLb and the other digit lines DLb0 to DLbn extend on the fourth inter-level insulating layer 36, and a passivation layer (not shown) covers the digit lines DLb and DLb0 to DLbn.

Although the digit lines DLa and DLa0 to DLan are partially overlapped with the digit lines DLb and DLb0 to DLbn, the fourth inter-level insulating layer 36 electrically isolates the digit lines DLa and DLa0 to DLan from the digit lines DLb and DLb0 to DLbn. For this reason, even if the memory cells M00 to Mmn are scaled down due to increase of the memory density, the digit lines DLa0/DLb0 to DLan/DLbn are not decreased in width at the same ratio as the memory cells M00 to Mmn, and propagate the potential differences without serious delay.

The semiconductor static random access memory device embodying the present invention is fabricated as follows. The n-type silicon substrate 31 is firstly prepared, and the p-type well 30 is formed in a surface portion of the n-type silicon substrate 31. The thick field oxide layer 32 is selectively grown in the surface of the n-type silicon substrate 31 and the p-type well 30, and the thick field oxide layer 32 defines the active areas A11 and A12. Thin gate oxide films 37 are grown on the active areas A11 and A12, and the common contact holes Cdp1 and Cdp2 are formed in the thin gate oxide films for exposing areas assigned to the drain regions SD2 and SD4.

Polysilicon is deposited over the entire surface, and the polysilicon layer is patterned through a lithographic process for providing the word lines WLa/WLb and the gate electrodes GE11/GE12. N-type dopant impurity is ion implanted into the active areas A11 and A12, the word lines WLa/WLb and the gate electrodes GE11/GE12, and the source and drain regions SD1/SD2/SD3/SD4/S1/S2 are formed in a self-aligned manner with the word lines WLa/WLb and the gate electrodes GE11/GE12.

The first inter-level insulating layer 33 is deposited over the entire surface of the structure, and the word lines WLa/WLb and the gate electrodes GE11/GE12 are covered with the first inter-level insulating layer 33. The ground contact holes Cg1 and Cg2 are formed through the first inter-level insulating layer 33 and the gate oxide films 37, and the source regions S1/S2 of the n-channel enhancement type driving transistors Qd1/Qd2 are exposed. A conductive substance is deposited over the entire surface of the structure, and the conductive layer is patterned into the ground voltage line VSS. The ground voltage line VSS is held in contact through the ground contact holes Cg1/Cg2 with the source regions S1/S2 of the n-channel enhancement type driving transistors Qd1/Qd2.

The second inter-level insulating layer 34 is deposited over the entire surface of the structure, and the ground voltage line VSS is covered with the second inter-level insulating layer 34. The contact holes Cdp1/Cdp2 are formed in the inter-level insulating layer 34, and the gate electrodes GE11/GE12 are exposed to the contact holes Cdp1/Cdp2. A conductive substance is deposited over the entire surface of the structure and the conductive layer is patterned into the gate electrodes GE13/GE14. As a result, the gate electrodes GE11/GE12 are respectively connected through the contact holes Cdp1/Cdp2 to the gate electrodes GE13/GE14.

A thin insulating film is deposited, and serves as the gate oxide films GI of the p-channel enhancement type load transistors Qp1/Qp2. The contact holes Cpg1/Cpg2 are formed in the gate insulating films GI, and polysilicon is deposited over the entire surface. The polysilicon is patterned into the polysilicon strips PL1/PL2, and the source and drain regions S3/D3 and S4/D4 are formed in the polysilicon strips PL1/PL2 as indicated by the hatching lines. The gate electrodes GE13 and GE14 are connected through the contact holes Cpg1 and Cpg2 to the drain regions D3 and D4, respectively.

The inter-level insulating layer 35 is deposited over the entire surface of the structure by using the chemical vapor deposition, and digit line contact hole Cd1 (not shown in FIG. 8) is formed in the inter-level insulating layers 33, 34 and 35 and the gate insulating films 37 and GI by using anisotropic etching. Contact holes Cd1' and Cd" for the digit lines DLa' and DLa" (see FIG. 8) are simultaneously formed in the inter-level insulating layers 33, 34 and 35 and the gate insulating films 37 and GI.

The contact holes Cd1, Cd1' and CD1" are plugged by using aluminum or tungsten pieces 38. Conductive metal is deposited over the entire surface to thickness of 300 to 1000 nanometers, and the digit lines DLa, DLa' and DLa" are patterned from the conductive metal layer.

The inter-level insulating layer 36 is deposited over the entire surface to thickness of 200 to 1000 nanometers by using the chemical vapor deposition, and contact holes Cd2, Cd2' and Cd2" are formed in the inter-level insulating layers 33, 34, 35 and 36 and the gate insulating films 37 and GI for the digit lines DLb, DLb' and DLb" by using the anisotropic etching. The contact holes Cd2, Cd2' and Cd2" are plugged by using the aluminum/tungsten pieces 39, and the conductive metal is deposited over the entire surface to thickness of 300 to 1000 nanometers. The digit lines DLb, DLb' and DLb" are patterned from the conductive metal layer. The digit lines DLb, DLb' and DLb" are respectively paired with the digit lines DLa, DLa' and DLa". Though not shown in FIG. 8, an inter-level insulating layer is further deposited over the digit lines DLb0 to DLbn, and the positive power voltage line VCC connected to the source regions of the p-channel enhancement type load transistors Qp1 and Qp2 is formed on the inter-level insulating layer. Finally, the positive power voltage line VCC is covered with a passivation layer (not shown).

The digit lines DLa0, DLa, DLa', DLa", ... DLan are partially overlapped with the digit lines DLb0, ... , DLb, DLb', DLb", ... and DLbn, and the digit lines DLa0 to DLan and DLb0 to DLbn are arranged at pitches wider than that of the prior art. As a result, the width of the digit lines DLa0 to DLan and DLb0 to DLbn are increased at least twice greater than the width of the digit lines of the prior art, and the thickness is also increasable. The semiconductor static random access memory device implementing the first embodiment decreases the resistance of each digit line to 50 percent or less, and the signal delay is improved at 10 to 20 percent.

Second Embodiment

Figure 9:
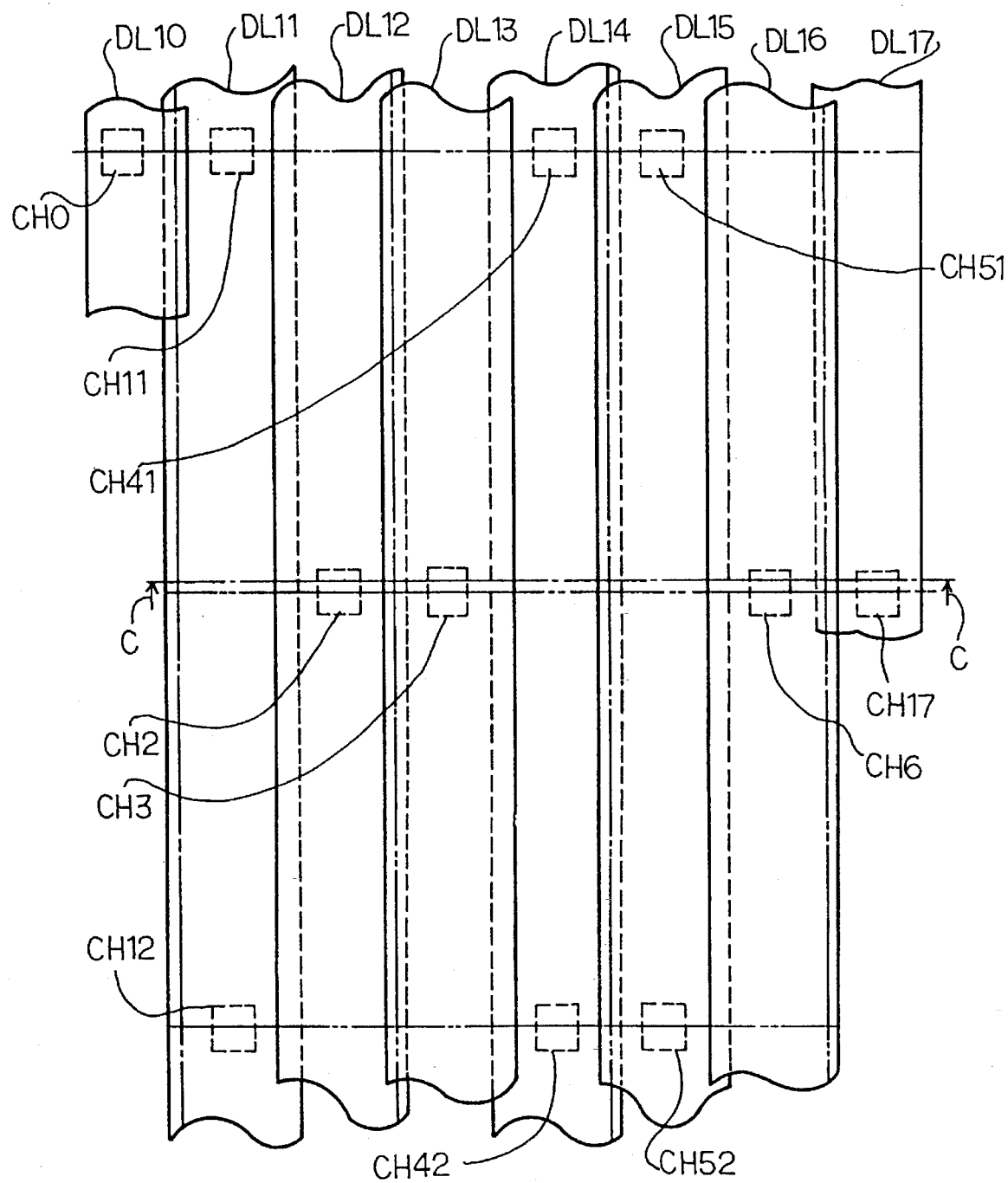
FIG. 9 is a plan view showing the layout of digit lines incorporated in another semiconductor memory device according to the present invention.
Figure 10:
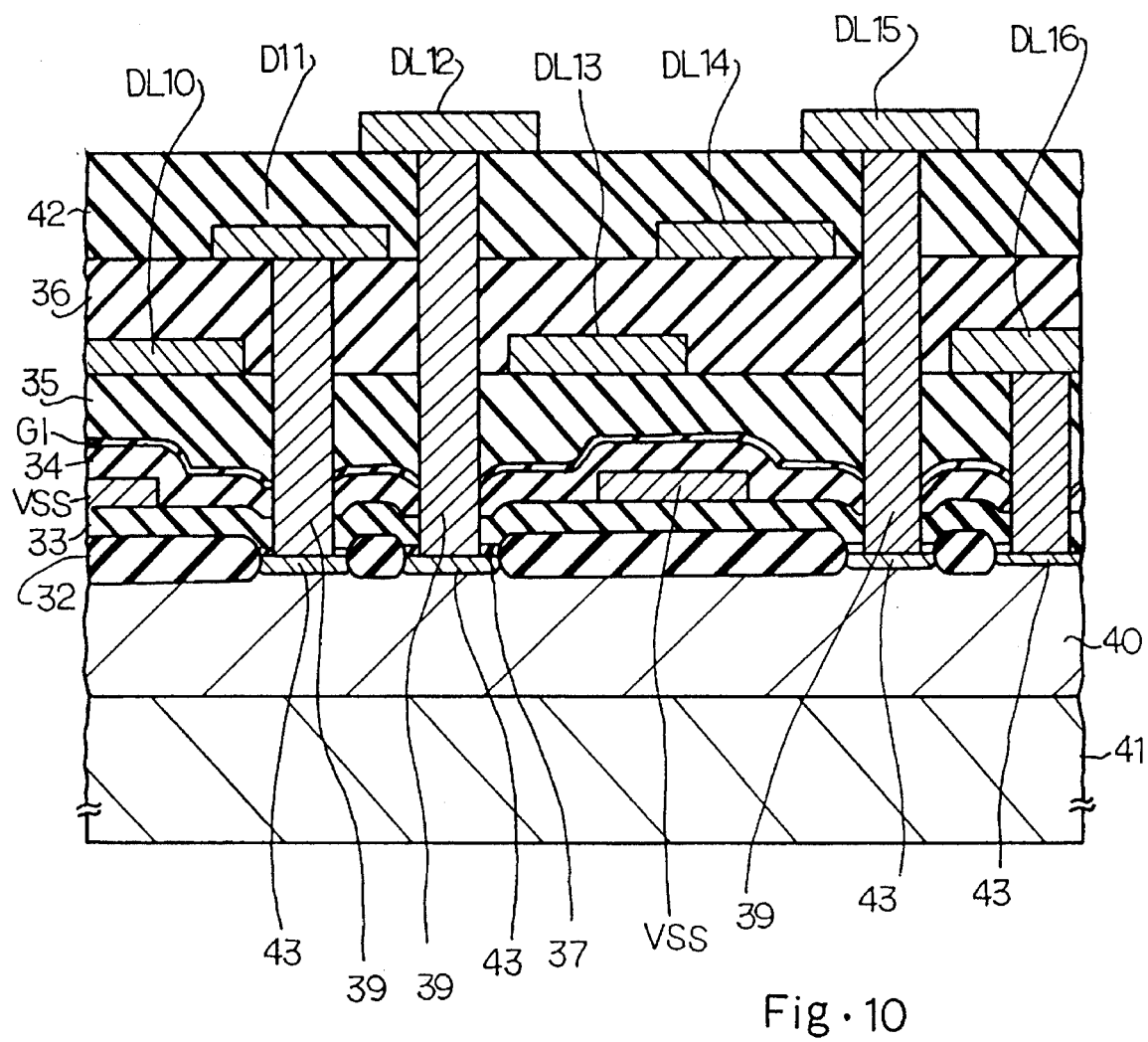
FIG. 10 is a cross sectional view taken along lines C—C of FIG. 9 and showing the structure of the semiconductor memory device.

Turning to FIGS. 9 and 10 of the drawings, another semiconductor memory device embodying the present invention is fabricated on a p-type well 40 of an n-type semiconductor substrate 41, and digit lines DL10 to DL17 selectively extend on different three inter-level insulating layers 35, 36 and 42. The layers of the semiconductor memory device corresponding to the layers of the first embodiment are labeled with the same references without detailed description.

The digit lines DL10 to DL17 are selectively paired with one another, and are connected through contact holes CH0, CH11/CH12, CH2, CH3, CH41/CH42, CH51/CH52, CH6 and CH7 to n-type source/drain regions 45 of access transistors of memory cells. The contact holes CH0 to CH7 are plugged with the pieces of aluminum or tungsten, respectively.

The digit line pairs DL10/DL11 to DL16/DL17 propagate potential differences indicative of data bits between a memory cell array (not shown) and a sense amplifier unit (not shown). The inter-level insulating layer 42 is 200 to 1000 nanometers, and the digit lines DL10 to DL17 are 300 to 1000 angstroms in thickness.

Every adjacent three digit lines such as DL10, DL11 and DL12 are formed on the different inter-level insulating layers 35, 36 and 42, and the adjacent digit lines on the same inter-level insulating layer such as DL10 and DL13 are spaced at intervals wider than that of the first embodiment. The digit lines DL10, DL13 and DL16, the digit lines DL11 and DL14 and the digit lines DL12 and DL15 are spaced at the same intervals, and the digit lines DL11 and DL14 are partially overlapped with the lower digit lines DL10 and DL13 and the upper digit lines DL12 and DL15. For this reason, each digit line DL10 to DL17 is increased in width and in thickness rather than the digit lines DLa0 to DLbn, and the signal delay is decreased at 20 to 30 percent.

In this instance, the adjacent three digit lines form a basic pattern, and the basic pattern is repeated. However, a lower digit line on the inter-level insulating layer 35, an intermediate digit line on the inter-level insulating layer 36, an upper digit line on the inter-level insulating layer 42 and another intermediate digit line may form a basic pattern, and the basic pattern is repeated for another semiconductor memory device according to the present invention.

Third Embodiment

Figure 11:
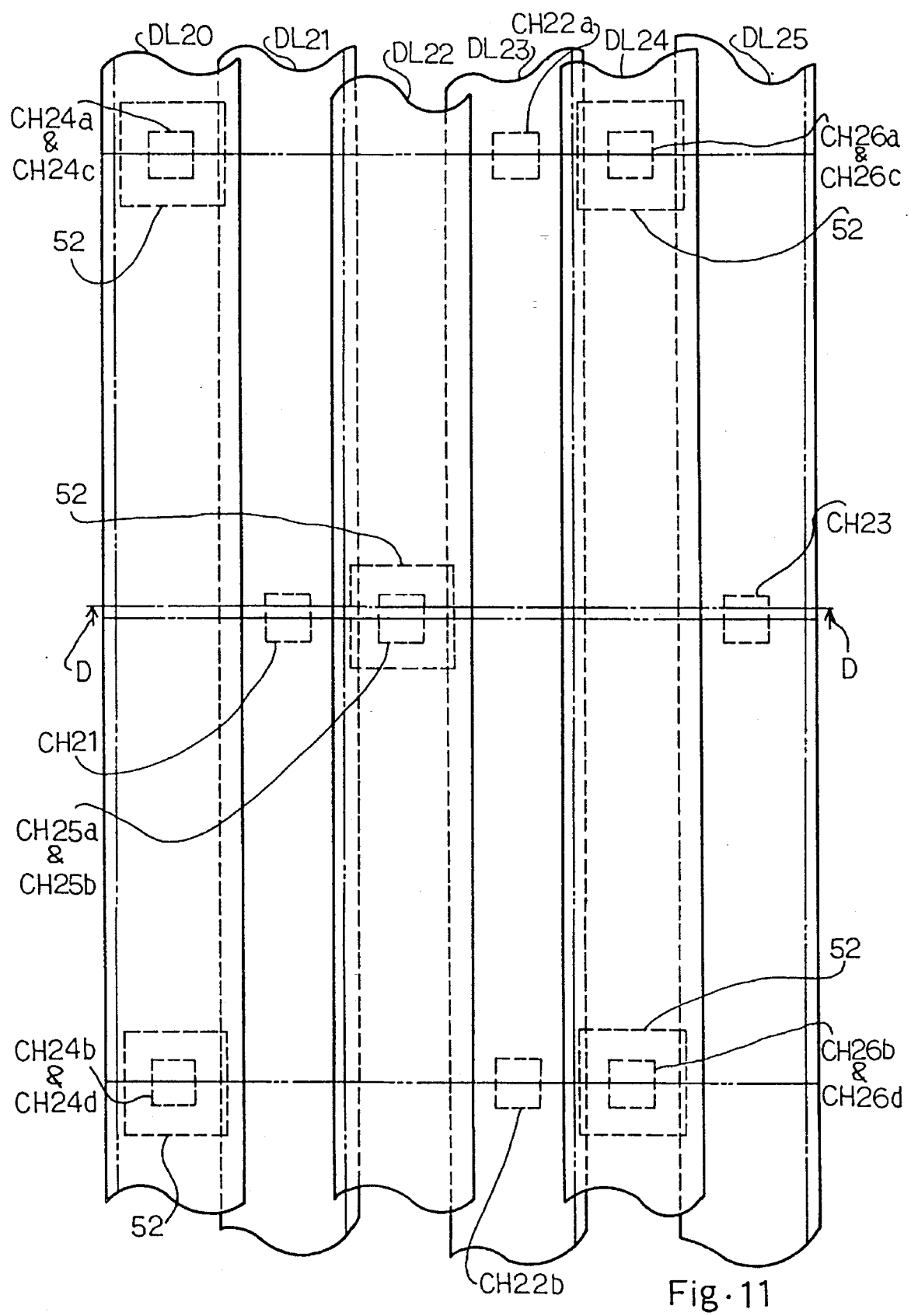
FIG. 11 is a plan view showing the layout of digit lines incorporated in yet another semiconductor memory device according to the present invention.
Figure 12:
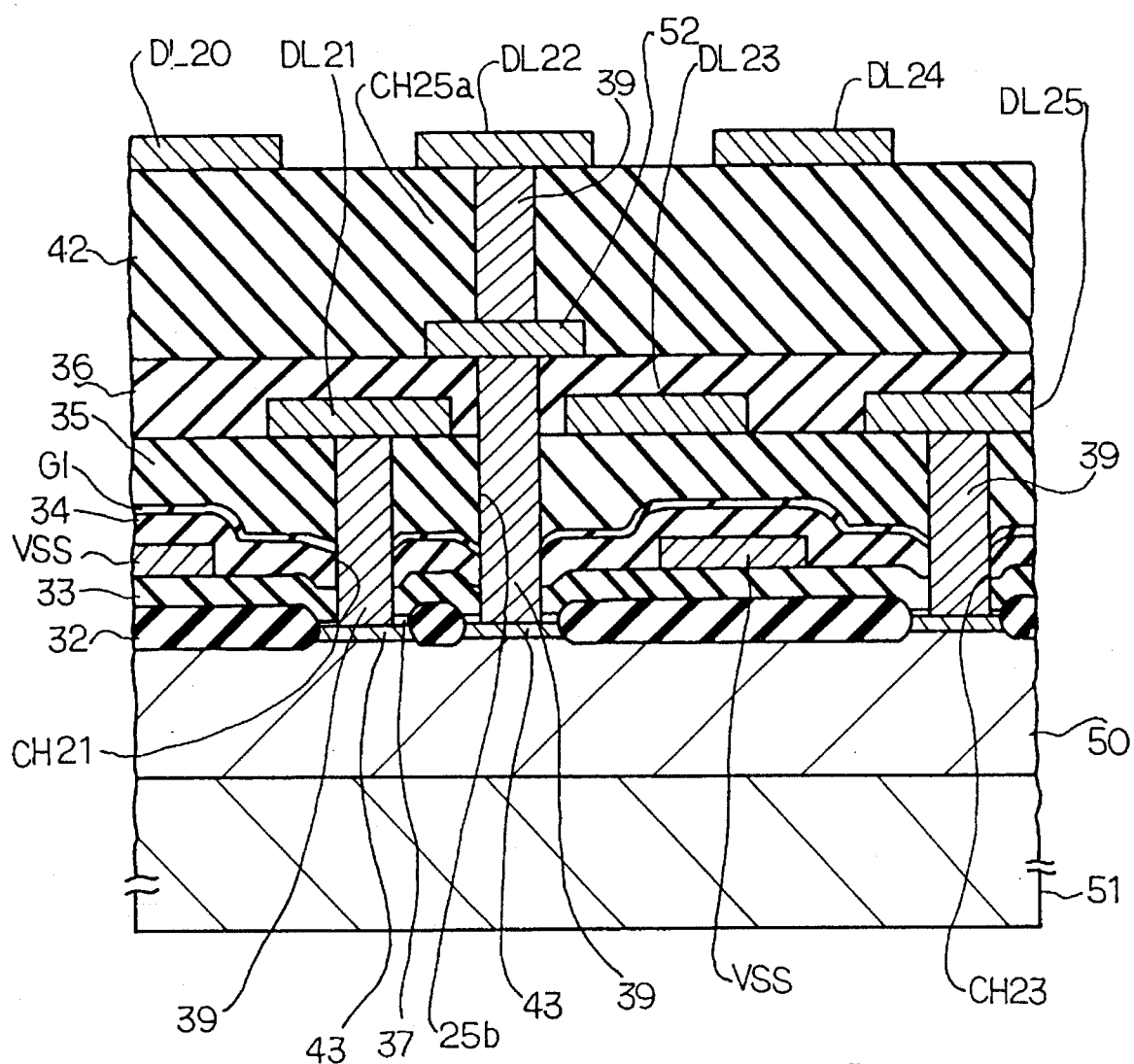
FIG. 12 is a cross sectional view taken along line D—D of FIG. 11 and showing the structure of the semiconductor memory device.

Turning to FIGS. 11 and 12 of the drawings, yet another semiconductor memory device embodying the present invention is fabricated on a p-type well 50 of an n-type semiconductor substrate 51, and digit lines DL20 to DL25 selectively extend on different two inter-level insulating layers 35 and 42. The layers and the regions of the semiconductor memory device corresponding to the layers and the regions of the second embodiment are labeled with the same references without detailed description.

The upper digit lines DL20, DL22 and DL24 are paired with the lower digit lines DL21, DL23 and DL25. The lower digit lines DL21 to DL25 are directly connected through contact holes CH21 , CH22a/CH22b and CH23 to n-type source/drain regions 45 of access transistors of memory cells. However, the upper digit lines DL20 to DL24 are connected through contact holes CH24a/CH24b, CH25a and CH26a/CH26b to pads 52 of aluminum or tungsten formed on the inter-level insulating layer 36, and the pads 52 in turn are connected through contact holes CH24c/CH24d, CH25b and CH26c/CH26d to n-type source/drain regions 45 of access transistors of other memory cells. All of the contact holes CH21 to CH26d are plugged with the pieces 39 of aluminum or tungsten, respectively.

The digit line pairs DL20/DL21 to DL24/DL25 propagate potential differences indicative of data bits between a memory cell array (not shown) and a sense amplifier unit (not shown).

The semiconductor memory device implementing the third embodiment is fabricated through the following process. The process sequence until the deposition of the inter-level insulating layer 35 is similar to the process sequence for the first embodiment. After the deposition of the inter-level insulating layer 35, the contact holes CH21, CH22a/CH22b and CH23 are formed in the inter-level insulating layers 34 and 35 and the gate insulating films 37 and GI by using the anisotropic etching. The contact holes CH21, CH22a/CH22b and CH23 are plugged with the pieces of aluminum or tungsten 39, and a conductive metal is deposited over the entire surface of the inter-level insulating layer 35. The conductive metal layer is patterned into the digit lines DL21, DL23 and DL25 through the lithographic process.

An insulating substance is deposited over the digit lines DL21, DL23 and DL25 by using a chemical vapor deposition to 50 to 1000 nanometers, and the contact holes CH24c, CH24d, CH25b, CH26c and CH26d are formed through the inter-level insulating layers 34, 35 and 36 and the gate insulating films 37 and GI by using the anisotropic etching.

The contact holes CH24c, CH24d, CH25b, CH26c and CH26d are plugged with the pieces of aluminum or tungsten 39, and the aluminum or tungsten is deposited over the inter-level insulating layer 36 to thickness of 100 to 800 nanometers. The aluminum layer or the tungsten layer is patterned into the pads 52, and the inter-level insulating layer 42 is deposited over the entire surface of the structure to thickness of 200 to 1000 nanometers by using the chemical vapor deposition.

The contact holes CH24a, CH24b, CH25, CH26a and CH26b are formed in the inter-level insulating layer 42 by using the anisotropic etching, and are plugged with the pieces 39 of aluminum or tungsten. A conductive substance is deposited over the inter-level insulating layer 42 to thickness of 300 to 1000 nanometers, and the conductive layer is patterned into the digit lines DL20 to DL24 through the lithographic process.

Though not shown in FIG. 12, an inter-level insulating layer is further deposited over the digit lines DLb0 to DLbn, and a positive power voltage line VCC is formed on the inter-level insulating layer for distributing a positive power voltage to circuit components. Finally, the positive power voltage line VCC is covered with a passivation layer (not shown).

The arrangement of the digit lines DL20 to DL25 is desirable for a designer. Although the lower digit lines DL21 to DL25 are partially overlapped with the upper digit lines DL20 to DL24, the total thickness of the inter-level insulating layers 36 and 42 ranges from 350 nanometers to 2000 nanometers thick, and the parasitic capacitance between the lower and upper digit lines is effectively decreased.

As will be understood from the foregoing description, the semiconductor memory device according to the present invention has digit lines selectively extending on the different inter-level insulating layers, and the memory cells are scaled down without shrinkage of the digit lines. This results in that a larger number of memory cells are integrated on the same semiconductor chip without signal delay on the digit lines.

Although particular embodiments of the present invention have been shown and described, it will be obvious to those skilled in the art that various changes and modifications may be made without departing from the spirit and scope of the present invention. For example, the set of the precharge circuit 21, the memory cell array 22, the row address decoder and word line driver unit 23, the column selector unit 24, the column address decoder unit 25, the sense amplifier unit 26 and the input/output unit 27 may be multiplied for a semiconductor static random access memory device according to the present invention, and the semiconductor static random access memory device may form a part of an ultra large scale integration. Moreover, the present invention is applicable to a semiconductor dynamic random access memory device and a non-volatile semiconductor memory device.

Moreover, the static random access memory cell is not limited to the circuit configuration shown in FIG. 1.

What is claimed is:

1. A semiconductor memory device fabricated on a semiconductor substrate, comprising:
   a memory cell array having a plurality of memory cells formed on a surface of said semiconductor substrate for storing data information;
   a plurality of word lines selectively connected to said plurality of memory cells so as to allow an external device to selectively access said plurality of memory cells;
   a plurality of data propagation paths selectively connected to said plurality of memory cells for transferring said data information from said memory cell array;
   an interface means for communicating said external device;
   an addressing system selectively energizing said plurality of word lines for transferring said data information through said plurality of data propagation paths between said memory cell array and said interface means; and
   an inter-level insulating film structure covering said memory cell array and said plurality of word lines, and having a plurality of inter-level insulating layers, said plurality of data propagation paths being selectively formed on said plurality of inter-level insulating layers.

2. The semiconductor memory device as set forth in claim 1, in which the data propagation paths formed on one of said plurality of inter-level insulating layers are partially overlapped with the data propagation paths formed on another of said plurality of inter-level insulating layers.

3. The semiconductor memory device as set forth in claim 1, in which a first inter-level insulating layer and a second inter-level insulating layer are incorporated in said plurality of inter-level insulating layers, and the data propagation paths formed on said first inter-level insulating layer are partially overlapped with the data propagation paths formed on said second inter-level insulating layer.

4. The semiconductor memory device as set forth in claim 3, in which a third inter-level insulating layer is further incorporated in said plurality of inter-level insulating layers between said first inter-level insulating layer and said second inter-level insulating layer, and said data propagation paths formed on said first inter-level insulating layer are respectively connected through conductive pads formed on said third inter-level insulating layer to the associated memory cells.

5. The semiconductor memory device as set forth in claim 1, in which a first inter-level insulating layer, a second inter-level insulating layer and a third inter-level insulating layer are incorporated in said plurality of inter-level insulating layers, and the data propagation paths formed on said first inter-level insulating layer are partially overlapped with the data propagation paths formed on said second inter-level insulating layer and the data propagation paths formed on said third inter-level insulating layer.

6. The semiconductor memory device as set forth in claim 1, in which each of said plurality of memory cells has a flip flop circuit having two memory nodes for storing a piece of said data information, and two access transistors coupled between two of said plurality of data propagation paths and said two memory nodes, respectively, and having respective control nodes coupled to the associated word lines.

7. The semiconductor memory device as set forth in claim 6, in which said flip flop has a series combination of a first load transistor, one of said two memory nodes and a first driving transistor coupled between a first power voltage line and a second power voltage line different in voltage level from each other, and a series combination of a second load transistor, the other of said two memory nodes and a second driving transistor coupled between said first power voltage line and said second power voltage line, said one of said two memory nodes being connected to a control node of said second load transistor and a control node of said second driving transistor, said other of said two memory nodes being connected to a control node of said first load transistor and a control node of said first driving transistor.

8. The semiconductor memory device as set forth in claim 7, in which said access transistors and said first and second driving transistors have source and drain regions formed in surface portions of said semiconductor substrate, and said first and second load transistors are thin film transistors formed over said access transistors and said first and second driving transistors.

9. A semiconductor memory device fabricated on a semiconductor substrate, comprising:

a memory cell array having a plurality of memory cells each having two inverters having respective input nodes and respective output nodes, the input node of each of said two inverters being connected to the output node of the other of said two inverters, and two access transistors having respective first transfer nodes and respective second transfer nodes respectively connected to said input nodes of said two inverters;

a plurality of digit lines selectively connected to said first transfer nodes of the access transistors of said plurality of memory cells; and a plurality of inter-level insulating layers provided over said memory cell array and laminated on one another, adjacent digit lines of said plurality of digit lines being formed on said plurality of inter-level insulating layers.

\* \* \* \* \*